United States Patent
Ahmad et al.

(10) Patent No.: US 6,316,952 B1
(45) Date of Patent: *Nov. 13, 2001

(54) FLEXIBLE CONDUCTIVE STRUCTURES AND METHOD

(75) Inventors: Syed Sajid Ahmad; Salman Akram, both of Boise, ID (US)

(73) Assignee: Micron Technology, Inc., Boise, ID (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/310,374

(22) Filed: May 12, 1999

(51) Int. Cl.⁷ ................................................. G01R 1/06
(52) U.S. Cl. .......................... 324/755; 324/754; 324/758
(58) Field of Search ................................ 324/755, 754, 324/760, 761, 765, 158.1; 439/70

(56) References Cited

U.S. PATENT DOCUMENTS

| | | | |
|---|---|---|---|
| 5,475,317 | 12/1995 | Smith | 324/760 |
| 5,533,515 | * 7/1996 | Coller et al. | 128/748 |
| 5,716,222 | 2/1998 | Murphy | 439/91 |
| 5,746,616 | * 5/1998 | Mar | 439/245 |
| 5,796,163 | 8/1998 | Glenn et al. | 257/698 |
| 5,810,609 | * 9/1998 | Faraci et al. | 439/71 |
| 5,831,832 | * 11/1998 | Gillette et al. | 361/760 |
| 6,020,747 | * 2/2000 | Bahns et al. | 324/754 |
| 6,043,670 | * 3/2000 | Degani et al. | 324/765 |
| 6,046,597 | * 4/2000 | Barabi | 324/755 |
| 6,046,598 | * 4/2000 | Miyaji et al. | 324/755 |
| 6,086,386 | * 7/2000 | Fjelstad | 324/755 X |
| 6,094,057 | * 7/2000 | Hiruta et al. | 324/755 |

* cited by examiner

Primary Examiner—Safet Metjahic
Assistant Examiner—T. R. Sundaram
(74) Attorney, Agent, or Firm—Dickstein Shapiro Morin & Oshinsky LLP

(57) ABSTRACT

An integrated circuit die test apparatus adapted to minimize damage to solder balls in a ball grid array. The apparatus includes a plurality of flexible pillars or other flexible support structures. The pillars may be formed of an electrically conductive polymer or other material, or formed of polymer and coated with a metallic substance. One or more pillars may be used to contact each solder ball during burn-in. The pillars flex under contact with the solder balls, and spring back upon disengagement. The support structures may be rectangular or wedge-shaped.

25 Claims, 5 Drawing Sheets

FLEXIBLE CONDUCTIVE STRUCTURES AND METHOD

BACKGROUND OF THE INVENTION

1. Field of the Invention

The present invention relates to a method and apparatus for connecting an integrated circuit to an external system, such as a test and burn-in system. More particularly, the present invention relates to the use of flexible conductive structures for performing test and burn-in of integrated circuit packages with ball grid arrays.

2. Description of the Related Art

Integrated circuit packages generally include internal and external structures utilized to electrically connect integrated circuits to external circuitry. One known type of integrated circuit package is a ball grid array ("BGA") package. BGA packages include an array of solder balls in a selected pattern on an external portion of the package. The solder balls are placed on metallic portions of external circuitry, such as a circuit board, and heated. Upon solidifying, the solder balls form conductive metal-to-metal bonds with the circuitry.

BGA packages are referred to in U.S. Pat. No. 5,796,163 (Glenn et al.), U.S. Pat. No. 5,716,222 (Murphy), and U.S. Pat. No. 5,831,832 (Gillette et al.). In Murphy and Gillette et al., the solder balls have rigid, solderable coverings. A potential problem with such a design is the creation of defects caused by fitting the coverings over the solder balls. Another potential problem is a loosening of the fit of the coverings over the solder balls, thus diminishing the electrical connections therebetween.

Prior to releasing an integrated circuit package for public use, it may be necessary to test and/or "burn-in" the integrated circuit. The procedure may be used to stabilize the characteristics of the integrated circuit die and reveal any defects therein.

One method for testing an integrated circuit package having a ball grid array is through the use of a plurality of silicon pillars on a test apparatus. The silicon pillars, which are electrically conductive, are placed in contact with the solder balls of the integrated circuit package to test or burn-in the package. The pillars provide electrical connections between the test apparatus and the individual elements of the ball grid array. A problem with utilizing silicon pillars, however, is their lack of flexibility. Due to their lack of flexibility, the silicon pillars may damage the solder balls on contact, thereby creating defects in the integrated circuit package. Damage sustained by the solder balls is due to excessive deformation, which results in decreased ability to solder.

U.S. Pat. No. 5,475,317 (Smith) refers to a conductive elastomeric probe which is screened onto bond pads used to test a singulated bare die. The elastomeric probes are used to ensure electrical connectivity. The invention described in Smith is directed to the testing of dies earlier on in the processing of the dies. The Smith patent does not suggest testing of dies which are further along the processing line, and it does not discuss the testing of dies which utilize solder balls.

SUMMARY OF THE INVENTION

The present invention addresses the problem of damage to solder balls in a ball grid array caused by inflexible electrical connections. The present invention relates to an apparatus for processing an integrated circuit die having a ball grid array of solder balls. The apparatus has a supporting surface and a plurality of flexible supports for receiving the solder balls.

The present invention also relates to a flexible support system for supporting solder balls located on an integrated circuit die. The flexible support system includes at least one support which flexes, thereby enabling it to impart significantly less deformation to the solder balls than that imparted by a rigid system.

The present invention also relates to a method of processing an integrated circuit die having a ball grid array of solder balls. The method includes the steps of moving the die toward a test and burn-in apparatus which has a supporting surface and a plurality of flexible supports, placing the die into electrical connection with the apparatus, and testing the die.

The present invention also relates to a method of receiving solder balls located on integrated circuit dies. The method includes the steps of positioning the dies such that the solder balls are above flexible support systems and lowering the dies such that the solder balls come into contact with the system, the system flexing in response to the contact.

These and other advantages will become apparent from the following detailed description of preferred embodiments of the invention.

DETAILED DESCRIPTION OF THE DRAWINGS

Figure 1:
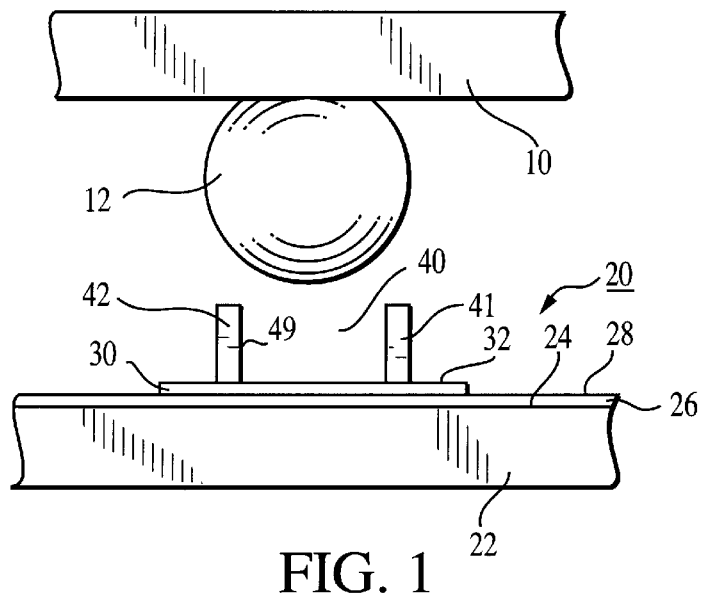
FIG. 1 is a partial side view of a semiconductor package and a flexible support system constructed in accordance with a preferred embodiment of the invention.

Referring now to the drawings, where like elements designate like elements, there is shown in FIG. 1 a semiconductor package having a die 10 and a solder ball 12 positioned above a support system 40. The support system has a pair of rectangularly shaped pillars 41, 42. The pillars 41, 42 are formed of material which flexes under force. Further, the pillars 41, 42 are formed of an electrically conductive material. The pillars 41, 42 may be formed of an electrically conductive polymer, for example. Alternatively, the pillars 41, 42 may be formed of a polymer and coated with a metallic substance 49 on one or more sides.

Conductive polymer is formed of metal particles entrained in polymer. The polymer binds the metal particles together. The metal particles may be chunks of metal, metal spheres or polymer particles coated with a metal.

Figure 2:
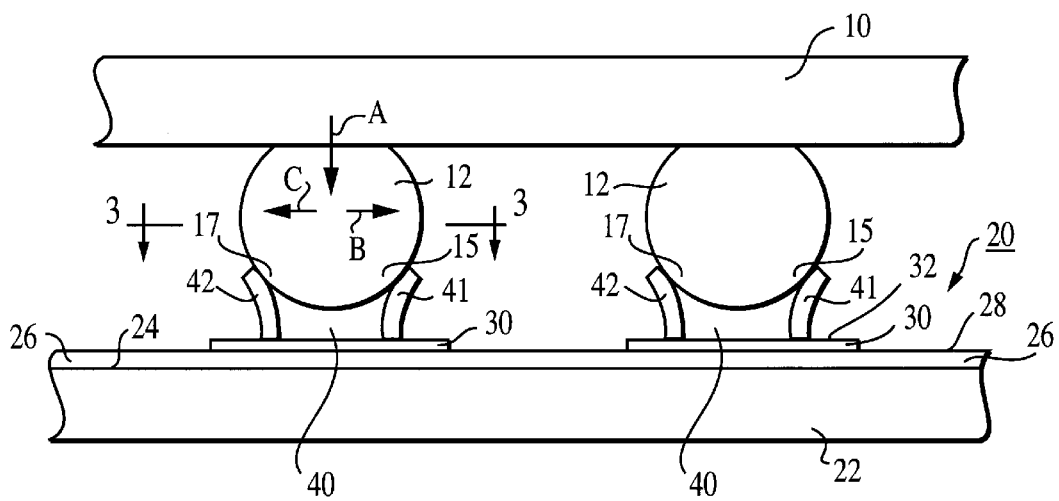
FIG. 2 is a partial side view like FIG. 1, showing a solder ball seated on the support system.
Figure 3:
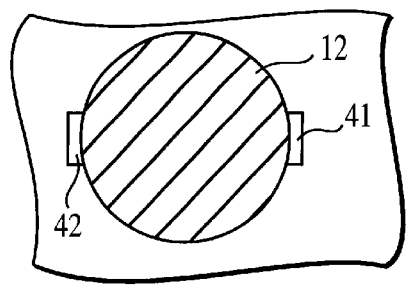
FIG. 3 is a cross-sectional view taken along the line 3—3 of FIG. 2.

FIGS. 2–3 show the solder ball 12 in contact with the support system 40. The pillars 41, 42, upon contact with the solder ball 12, flex away from each other in the directions of arrows B, C, thereby damping the impact force on the solder ball 12 in the direction of arrow A. The decrease in contact force upon the solder ball 12 consequently decreases the possibility of plastic deformation of the solder ball 12. Further, the flexing of the pillars 41, 42 causes the metal particles entrained in the conductive polymer material to be pushed closer together, decreasing the resistance and increasing the electrical current flow.

Every population of a ball grid array (BGA) design results in a minimum and a maximum solder ball 12 size, calculable through statistical techniques. The spacing between the pillars 41, 42 is preferably less than the circumference of the smallest solder ball 12 in the population to assure contact to all members of the population of balls 12. The spacing should be enough to cause flexing of the pillars 41, 42 upon contact with the solder ball 12, but not so great as to allow the solder ball 12 to come in contact with a metal layer 30 (described below). Further, the pillars 41, 42 should be located and of such a height to contact with, respectively, regions 15, 17 of the solder ball 12 that form acute angles with respect to the vertical direction A, especially the acute angles of the largest solder ball 12 in the population.

The support system 40 is located on a test and/or burn-in apparatus 20 (FIG. 2). The apparatus 20 may be used to process and/or evaluate the integrated circuit die 10. The test and burn-in apparatus 20 is used to test the integrated circuit die 10 prior to its release for application. A burn-in test is used to stabilize the characteristics of the die 10 and to reveal any defects. While only two solder balls 12 are shown in FIG. 2, it is to be understood that the die 10 may include a greater number of solder balls 12 in a ball grid array or a fine ball grid array (FBGA), defined as being less than one millimeter in size.

The test and burn-in apparatus 20 includes a substrate 22, an oxide layer 26, and the metal layer 30. The substrate 22 is preferably formed of silicon, FR-4 board, ceramics, an organic epoxy-glass resin based material such as bismaleimide-triazine (BT) resin, or other suitable materials. If the substrate 22 is formed of silicon, a layer of oxide 26 is deposited upon an upper surface 24 for purposes of insulation. The layer of oxide 26 has an upper surface 28 upon which the metal layer 30 is deposited. The metal layers 30 have upper surfaces 32 upon which the pillars 41, 42 are positioned.

As shown in FIG. 2, the solder balls 12 are each in contact with a pair of the pillars 41, 42. The pillars 41, 42, which are in contact with the angled sides 15, 17 of the solder balls 12, are flexed away from each other. Since the pillars 41, 42 are electrically conductive, electricity may flow through the metal layer 30, through the pillars 41, 42, and into and through the solder balls 12 to the die 10 during the test and/or burn-in procedure. After the test and/or burn-in, the die 10 and solder balls 12 may be moved away from the test and burn-in apparatus 20. Upon disengagement of the solder balls 12 from the support systems 40, the pillars 41, 42 spring back to their original, vertical shape.

Figure 4:
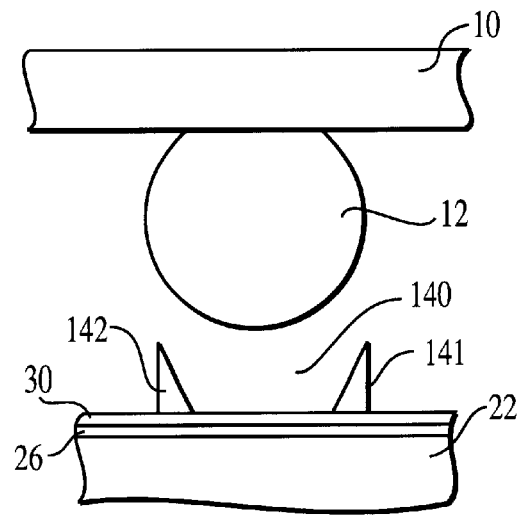
FIG. 4 is a partial side view of a semiconductor package and a flexible support system constructed in accordance with a second preferred embodiment of the invention.
Figure 5:
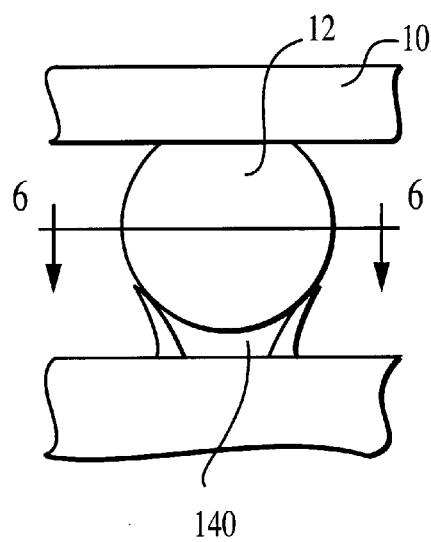
FIG. 5 is a partial side view like FIG. 4, showing a solder ball seated on the support system.
Figure 6:
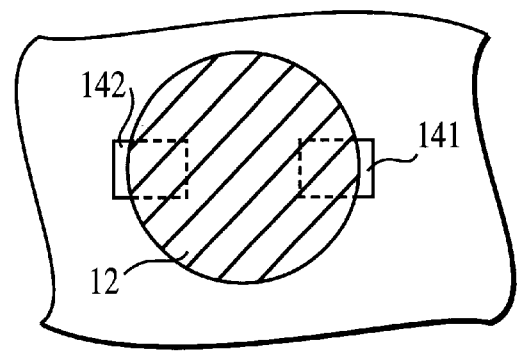
FIG. 6 is a cross-sectional view taken along the line 6—6 of FIG. 5.

With reference to FIGS. 4–6, a second preferred embodiment of the present invention is illustrated. In FIG. 4, a solder ball 12 is shown positioned above a support system 140. The support system 140 includes a pair of supports 141, 142 which are generally wedge-shaped. More particularly, each support 141, 142 has a right angle. As shown in FIG. 5, as the solder ball 12 is lowered into contact with the support system 140, the supports 141, 142 flex away from each other. The wedge shape of the supports 141, 142 is advantageous in that it may allow greater flex near the solder ball 12 and less flex near the base of each support 141, 142. Thus, the vertical component of force applied to the solder ball 12 will increase gradually as the ball 12 is located on the support system 40.

Figure 7:
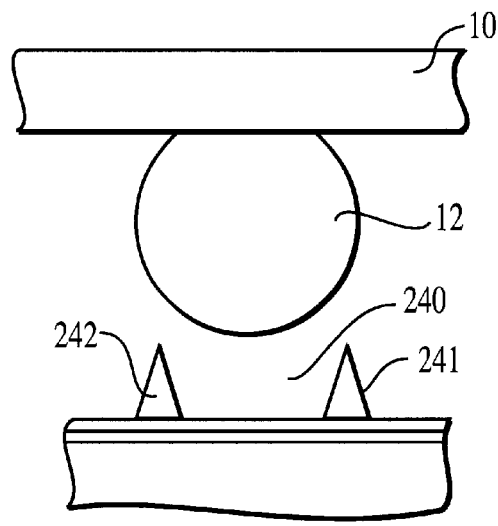
FIG. 7 is a partial side view of a semiconductor package and a flexible support system constructed in accordance with a third preferred embodiment of the invention.
Figure 8:
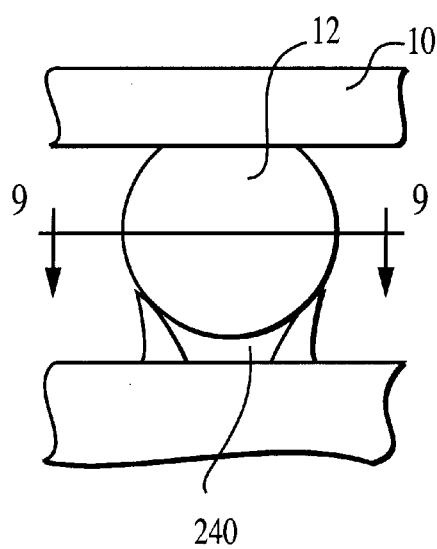
FIG. 8 is a partial side view like FIG. 7, showing a solder ball seated on the support system.
Figure 9:
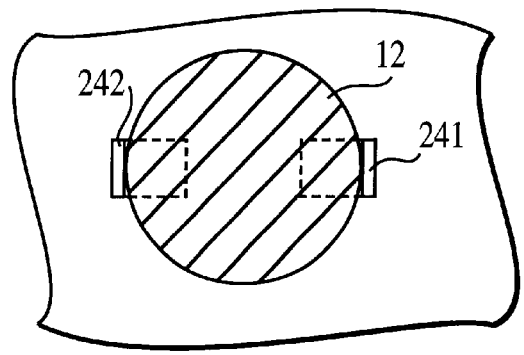
FIG. 9 is a cross-sectional view taken along the line 9—9 of FIG. 8.

With reference to FIGS. 7–9, a third preferred embodiment of the present invention is illustrated. Specifically, a support system 240 having a pair of supports 241, 242 are shown beneath a solder ball 12. The supports 241, 242 are both wedge-shaped. However, the supports 241, 242 do not have a right angle. As shown in FIG. 8, the supports 241, 242 flex away from the solder ball 12 when the solder ball 12 comes into contact with the support system 240.

Figure 10:
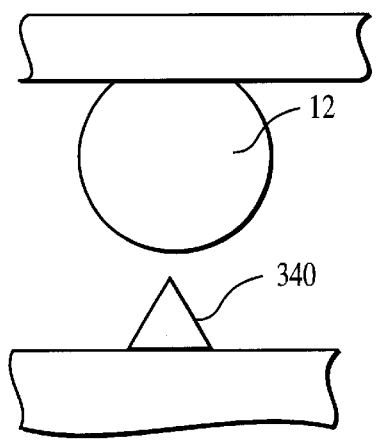
FIG. 10 is a partial side view of a solder ball and a support system constructed in accordance with a fourth preferred embodiment of the invention.
Figure 11:
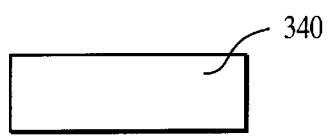
FIG. 11 is a front view of a support element for the support system of FIG. 10.

With reference to FIGS. 10–11, a fourth preferred embodiment of the present invention is illustrated. Specifically, a singular support 340 is shown beneath a solder ball 12. In instances where there is a large variation in the placement of the solder balls 12 in an array, more than one form of structure may be required. The support 340 is wedge-shaped, generally like the supports 141, 142, 241, 242. However, with reference to FIG. 11, it is shown that the support 340 is of greater length than the supports 141, 142, 241, 24. In addition, the solder ball 12 is positioned to contact a single support 340, as opposed to the pairs of supports described above. More particularly, the solder ball 12 is lowered into position such that it touches the apex of the support 340. The smaller amount of area of the support 340 coming in contact with the solder ball 12 lessens the likelihood of any damage occurring to the solder ball. The dimensions of the support 340 are determined by the amount of variation in the dimensions and placement of the solder balls 12 population to be contacted.

The support 340 may be approximately as long as the diameter of the ball 12. The elongated configuration of the support 340 is advantageous because it ensures good electrical contact between the ball 12 and the support 340 even when the semiconductor package is slightly misaligned with respect to the apparatus 20.

Figure 12:
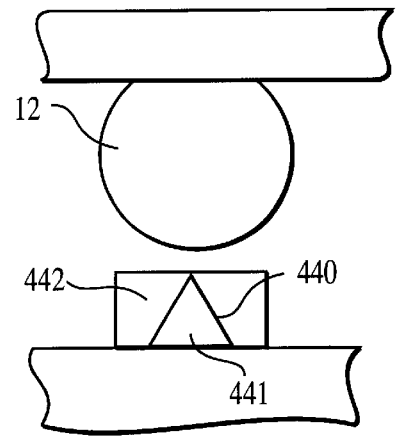
FIG. 12 is a partial side view of a solder ball and a support system constructed in accordance with a fifth preferred embodiment of the invention.
Figure 13:
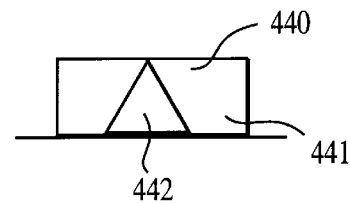
FIG. 13 is a front view of a support element for the support system of FIG. 12.

With reference to FIGS. 12–13, a fifth preferred embodiment of the present invention is illustrated. As shown in FIG. 12, a solder ball 12 is positioned above a support system 440. The support system 440 is a combination of two supports 441, 442 positioned in an X shape. As with the support 340, as the solder ball 12 is lowered into contact with the support system 440, the solder ball 12 comes in contact with the apex of the support system 440, preferably where the supports 441, 442 meet. The support system 440 accommodates misalignment of the semiconductor package in two orthogonal directions.

Figure 14:
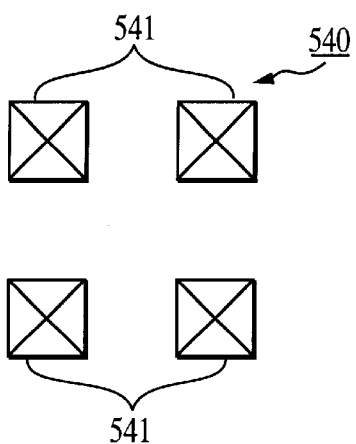
FIG. 14 is a top view of a support system constructed in accordance with a fifth preferred embodiment of the invention.
Figure 15:
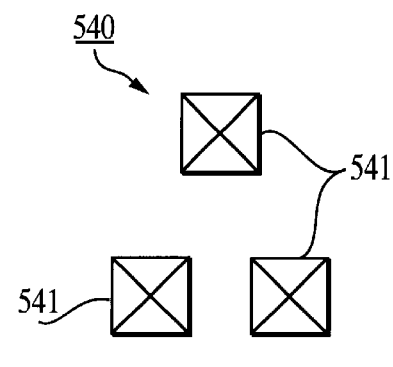
FIG. 15 is a top view of an alternative positioning of support elements of the support system of FIG. 14.

Alternatively, more than two support structure can be used to assume contact when necessary, especially in instances of large variations in placements of the solder balls 12 in an array. FIGS. 14–15 show a support system 540 comprising a plurality of pyramidal support structures 541 used in conjunction. Specifically, FIG. 14 shows four support structures 541 in a square pattern, while FIG. 15 shows three support structures 541 in a triangular pattern.

The present invention provides an apparatus and method for testing an integrated circuit die having a ball grid array without excessively damaging the plurality of solder balls in the array. The apparatus includes the use of flexible, electrically conductive pillars. Modifications can be made to the invention and equivalents substituted for described and illustrated structures without departing from the spirit or scope of the invention. For example, while FIGS. 1–9 show two support structures for reducing contact force, the two structures may be replaced with one support structure. The alignment for one support structure is more critical as well as the placement accuracy of the solder balls 12. More than two structures may be used, as shown in FIGS. 14–15. The increased number of support structures will, however, create increased contact force. Further, a circular support structure may be used to contact a distribution of solder balls 12, resulting in the highest force requirements. Also, the support structures may be any suitable shape, such as, for example, columnar. Further, differently shaped supports may be used in a single support system, such as, for example, a wedge-shaped and a pyramidal support. Accordingly, the scope of the present invention is not to be considered as limited by the specifics of the particular structure which have been described and illustrated, but is only limited by the scope of the appended claims.

What is claimed as new and desired to be protected by Letters Patent of the United States is:

1. An apparatus for testing an integrated circuit die having a ball grid array of solder balls comprising:
   a supporting surface; and
   a plurality of elastic supports adapted to temporarily connect with said solder balls, said elastic supports comprise pillars extending orthogonal to said support surface, each said pillar having a surface which contacts one of said solder balls.

2. The apparatus of claim 1, wherein two supports are positioned to receive each solder ball.

3. The apparatus of claim 1, further including:
   a layer of oxide deposited upon said supporting surface; and
   at least one deposition layer of metal upon said layer of oxide.

4. The apparatus of claim 3, wherein said supports are positioned upon said layer of metal.

5. The apparatus of claim 1, wherein said supports are rectangular.

6. The apparatus of claim 1, wherein said supports are wedge-shaped.

7. The apparatus of claim 1, wherein said supports are pyramidal.

8. The apparatus of claim 1, wherein said supports are columnar.

9. The apparatus of claim 1, wherein at least one said support is shaped differently than the other said supports.

10. The apparatus of claim 1, wherein said supports flex in response to contact with the solder balls.

11. The apparatus of claim 10, wherein said supports spring back to parallel positions once contact with the solder balls is disengaged.

12. An apparatus for testing an integrated circuit die having a ballgrid array of solder balls; comprising:
   a supporting surface;
   a layer of oxide deposited upon said supporting surface;
   at least one deposition layer of metal upon said layer of oxide; and
   a plurality of elastic supports adapted to receive said solder balls, said supports comprising pillars extending orthogonal to said supporting surface and each with a surface which contacts one of said solder balls, wherein two said pillars each are positioned to receive each said solder ball, and wherein said pillars flex away from each other to receive the solder balls and spring back when the solder balls are removed.

13. The apparatus of claim 12, wherein said supports are positioned upon said layer of metal.

14. The apparatus of claim 12, wherein said supports are rectangular.

15. The apparatus of claim 12, wherein said supports are wedge-shaped.

16. An elastic support system for supporting at least one solder ball positioned on an integrated circuit die being tested, said elastic support system comprising at least one pillar oriented orthogonal to a surface of the integrated circuit on which the solder balls is positioned, said pillar being formed of a conductive polymer material having a certain resistance to electric current and being adapted to temporarily connect with and flex to avoid damage to the solder ball, wherein upon flexing said certain resistance is decreased.

17. The system of claim 16, wherein said at least one pillar flexes in response to contact with the solder ball.

18. The system of claim 16, wherein two said pillars contact said solder ball.

19. A method of testing an integrated circuit die having a ball grid array of solder balls, said method comprising the steps of:
   moving said die toward a test and burn-in apparatus, said apparatus including:
      a supporting surface; and
      a plurality of elastic supports, the supports comprising pillars extending orthogonal to the supporting surface, each said pillar having a surface which contacts one of the solder balls;
   placing said die and said apparatus in electrical connection with one another; and
   testing and burning-in said die.

20. The method of claim 19, further comprising the step of protecting said solder balls against plastic deformation during said electrical connection.

21. The method of claim 20, wherein said step of protecting said solder balls is accomplished through said supports flexing in response to contact with said solder balls, thereby reducing the contact force on said solder balls.

22. The method of claim 21, further comprising the step of disengaging said electrical connection.

23. The method of claim 22, wherein upon said disengagement of said electrical connection said supports spring back to their original shape.

24. A method of receiving solder balls postioned upon integrated circuit dies during testing of said dies, said method comprising the steps of:
   positioning said dies such that solder balls are adjacent respective elastic support systems comprising pillars extending orthogonal to a surface of said integrated circuit dies upon which solder balls are positioned; and
   providing movement between said dies and said elastic support systems such that said solder balls come into contact with elastic support systems flexing in response to said contact.

25. The method of claim 24, further comprising the step of raising said dies after processing has been completed, wherein said systems spring back to their original shape upon said contact being disengaged.

* * * * *